US006865133B2

(12) United States Patent
Tsukidate et al.

(10) Patent No.: US 6,865,133 B2
(45) Date of Patent: Mar. 8, 2005

(54) MEMORY CIRCUIT WITH REDUNDANT CONFIGURATION

(75) Inventors: Yoshihiro Tsukidate, Kawasaki (JP); Kazuhiro Kurihara, Kawasaki (JP); Yasushi Kasa, Kawasaki (JP); Tsutomu Nakai, Kawasaki (JP); Andy Cheung, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 10/652,035

(22) Filed: Sep. 2, 2003

(65) Prior Publication Data

US 2004/0109371 A1 Jun. 10, 2004

(30) Foreign Application Priority Data

Sep. 11, 2002 (JP) ........................................ 2002-265065

(51) Int. Cl.[7] ................................................ G11C 8/00
(52) U.S. Cl. .............. 365/230.01; 365/200; 365/230.03
(58) Field of Search ............................. 365/201, 230.03, 365/189.07, 230.01, 226, 200

(56) References Cited

U.S. PATENT DOCUMENTS 5,473,765 A * 12/1995 Gibbons et al. .............. 703/24
5,715,423 A * 2/1998 Levy ........................... 711/103

FOREIGN PATENT DOCUMENTS

JP 2000-231795 8/2000

* cited by examiner

Primary Examiner—Thong Q. Le
(74) Attorney, Agent, or Firm—Arent Fox PLLC

(57) ABSTRACT

A memory circuit has a plurality of blocks which further comprises a plurality of regular sectors and a spare sector, wherein each sector further comprises a plurality of memory cells, and when a regular sector in a first block is defective, this defective regular sector is replaced with a spare sector in a second block. And responding to an address to be supplied, the regular sector corresponding to the supplied address in the first block and the spare selector in the second block are selected simultaneously during a first period, and after the first period, selection of one of the regular sector and the spare sector is maintained according to the result of redundancy judgment on whether the supply address matches with the redundant address. Regardless the result of redundancy judgment on whether the supplied address matches the redundant address indicating the defective sector, a regular sector in the first block and the spare sector in the second block, to be a pair thereof, are set to selected status simultaneously during the first period when access operation stars, so a drop in access speed due to a redundancy judgment operation can be suppressed.

18 Claims, 15 Drawing Sheets

FIG. 4  Simultaneously Selected State for Regi WL and Spare WL

FIG. 7    Vertical Block Select Signal Buffer Circuit
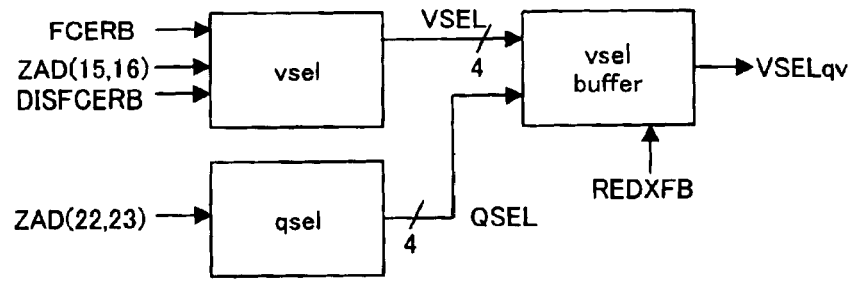
FIG. 8
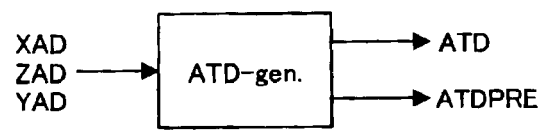
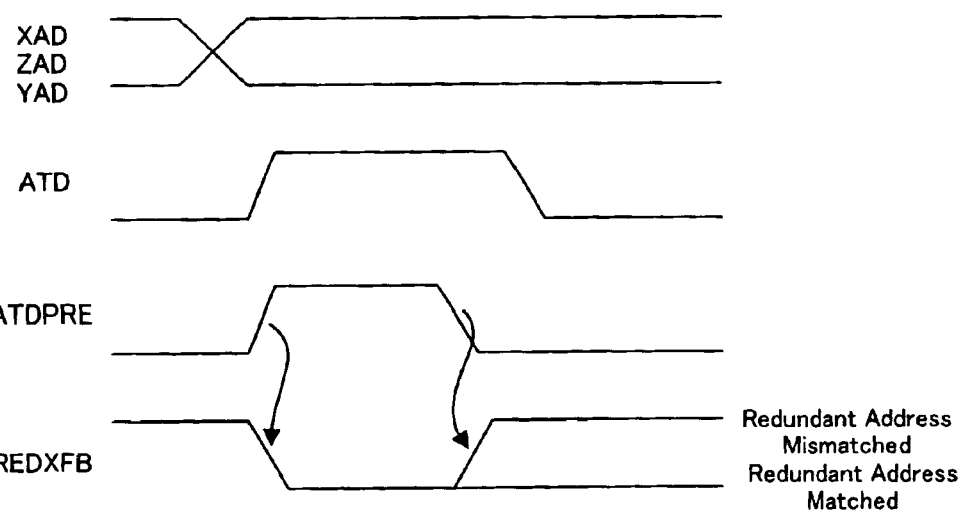

Redundancy Judgment Circuit

REDX

FIG. 11
Boost Power Supply Distribution Circuit
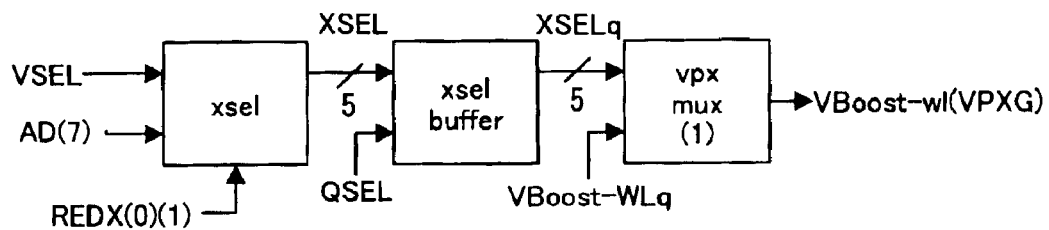
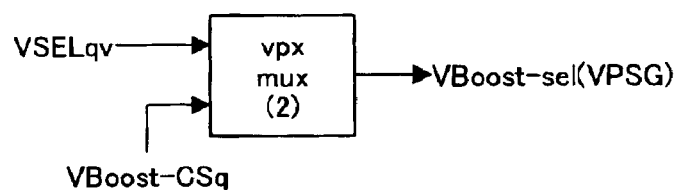

MEMORY CIRCUIT WITH REDUNDANT CONFIGURATION

CROSS-REFERENCE TO RELATED APPLICATIONS

This application is based upon and claims the benefit of priority from the prior Japanese Patent Application No. 2002-265065, filed on Sep. 11, 2002, the entire contents of which are incorporated herein by reference.

BACKGROUND OF THE INVENTION

1. Field of the Invention

The present invention relates to a memory circuit with a redundant configuration, and more particularly to a memory circuit where a drop in access speed due to redundancy judgment is prevented.

2. Description of the Related Art

A semiconductor memory device has a redundant configuration for repairing defective cells which are generated due to miniaturization as capacity increases and other causes. Various redundant configurations are used for such semiconductor memories as DRAM, SRAM, FeRAM and EEPROM (flash memory). Of these, flash memory uses a redundant configuration of bit lines as a repair method of defective cells. In other words, a bit line to which a defective cell belongs is replaced with a bit line in a redundant cell side for reading. This memory is stated in Japanese Patent Laid-Open No. 2000-231795 (published on Aug. 22, 2000).

In this kind of flash memory, defects of word lines and sectors, which are the units of erasing, are becoming a major cause of a drop in yield, due to increasing capacity. Therefore for a large capacity flash memory, a redundant configuration of word lines and a redundant configuration of sectors are being proposed. A flash memory has a plurality of sectors in a memory block. In such a configuration, a spare sector for repairing is provided in the memory block. And if the supplied address and the address of the defective sector (hereafter redundant address) match, the spare sector is selected instead of the regular sector.

A drop in access speed is the problem in such a memory with a redundant configuration. In other words, the address to be supplied and the redundant address are compared, and if they do not match, the data of the regular sector is read as is, but if they match, it is necessary to select the spare sector side and read the data. Therefore selection start timing at the spare sector side delays for the amount of time required for comparison judgment with the redundant address. In particular, when the word lines at the spare sector side are driven after judgment of the redundant address is completed, a drop in access speed is more conspicuous than the bit line redundant configuration.

Also along with disposing spare sectors for repairing defects, a spare sector operation test is required at pre-shipment testing. The spare sector can be accessed by writing the redundant address in the redundant memory, but it is desirable to perform an operation test of the spare sector before writing to the redundant memory. It is also necessary to perform an operation test of the repaired regular sector to verify defective mode after replacing with the spare sector by writing the redundant address. In such a case, even if the redundant address is written, an operation test of the replaced regular sector must be performed.

SUMMARY OF THE INVENTION

With the foregoing in view, it is an object of the present invention to provide a memory circuit where a drop in access speed due to redundancy judgment is prevented.

It is another object of the present invention to provide a memory circuit which enables an operation test of the spare sectors and repaired regular sectors regardless the redundant address.

To achieve the above objects, one aspect of the present invention is a memory circuit comprising a plurality of blocks which further comprises a plurality of regular sectors and a spare sector, wherein each sector further comprises a plurality of memory cells, and when a regular sector in a first block is defective, this defective regular sector is replaced with a spare sector in a second block. And responding to an address to be supplied, the regular sector corresponding to the supplied address in the first block and the spare selector in the second block are selected simultaneously during a first period, and after the first period, selection of one of the regular sector and the spare sector is maintained according to the result of redundancy judgment on whether the supply address matches with the redundant address.

According to the above aspect of the present invention, regardless the result of redundancy judgment on whether the supplied address matches the redundant address indicating the defective sector, a regular sector in the first block and the spare sector in the second block, to be a pair thereof, are set to selected status simultaneously during the first period when access operation stars, so a drop in access speed due to a redundancy judgment operation can be suppressed.

In the above aspect of the present invention, it is preferable that each sector further comprises a plurality of word lines respectively, and when the regular sector in the first block and the spare sector in the second block are simultaneously selected responding to the supplied address, the word lines in this regular sector and spare sector are simultaneously selected.

In the above aspect of the present invention, it is preferable that the simultaneously selected word lines are driven to the power supply voltage level in the first period, and after the first period ends, the word line which is selected according to the result of redundancy judgment is drive to a boost power supply voltage level, which is higher than the power supply voltage. The word line which is not selected drops to ground level.

In the above aspect of the present invention, it is preferable that a word line decoder for selecting a word line in the sector is disposed in each sector, and the input signal of the word line decoder is supplied to the first and second blocks. In other words, the input signal of the word line decoder is supplied to the first block selected by the supplied address and the second block, which is a pair of the first block. This makes it possible to select a word line by the word line decoder in the regular sector and to select a word line by the word line decoder in the spare sector, which are selected simultaneously.

Also in a preferred embodiment, a Y gate circuit for selecting a bit line in a block is disposed in each block, and a bit line in the first block is selected when the result of redundancy judgment is a mismatch, and a bit line in the second block is selected when the result of redundancy judgment is a match. And it is preferable that both of these bit lines are never selected simultaneously while the regular sector and the spare sector are simultaneously selected during the first period. By this, contention of both of these bit lines via a common data bus line can be prevented.

In the above embodiment, it is preferable that a Y gate select signal to be supplied to a Y gate circuit starts to be driven according to the result of redundancy judgment before the first period ends. Since the timing of the result of redundancy judgment by a redundancy judgment circuit disperses, the first period is set during which the regular sector and the spare sector thereof are simultaneously selected. As a result, the Y gate is selected by either the first or second block. Therefore selection of the Y gate may be switched depending on the result of redundancy judgment. By switching the selection of the Y gate, the boost power supply level for sharing power supply with the Y gate select signal drops. In the preferred embodiment, delay of recovery of the column boost power supply which supplies power of the Y gate select signal can be prevented by driving the Y gate select signal before ending the first period.

In the above aspect of the present invention, when replacement with a spare sector is not executed, sectors of a plurality of blocks can become the erase operation target simultaneously, and when replacement with a spare sector in the plurality of blocks is executed, this simultaneous erase operation is prohibited. When a switch to the spare sector is executed, the regular sector and a spare sector, which replaces the defective regular sector in another block, become the erase operation target in a same block, so in this case, a simultaneous erase operation is disabled.

To achieve the above object, another aspect of the present invention is a memory circuit comprising a plurality of regular sectors and spare sectors, which further comprises a redundant memory for storing an address of a defective regular sector and a redundancy judgment circuit for comparing a supplied address and the address in the redundant memory, wherein either the regular sector or a spare sector which is replaced therewith is selected depending on the redundancy judgment signal generated by the redundancy judgment circuit. And responding to the first signal, the redundancy judgment circuit sets the redundancy judgment signal to a match status to enable access to the spare sector regardless the address in the redundant memory.

Also to achieve the above object, another aspect of the present invention is a memory circuit comprising a plurality of regular sectors and spare sectors, which further comprises a redundant memory for storing an address of a defective regular sector, and a redundancy judgment circuit for comparing a supplied address and the address in the redundant memory, wherein either the regular sector or a spare sector which is replaced therewith is selected depending on the redundancy judgment signal generated by the redundancy judgment circuit. And responding to the second signal, the redundancy judgment circuit sets the redundancy judgment signal to a mismatch status, regardless the address in the redundant memory, to enable access to the regular sector which is replaced with the spare sector.

According to the above two aspects, access to the spare sector is enabled even before the redundant address is written to the redundant memory, and the spare sector can be tested. Also access to the regular sector which is replaced with the spare sector is enabled even after the redundant address is written to the redundant memory, so the regular sector judged as defective can be tested.

BRIEF DESCRIPTION OF THE DRAWINGS

FIG. 7 is a diagram depicting the vertical block select signal buffer circuit;

FIG. 8 is a diagram depicting the address transition detection circuit and the operation timing chart thereof;

FIG. 11 is a diagram depicting the boost power supply distribution circuit;

DESCRIPTION OF THE PREFERRED EMBODIMENTS

Embodiments of the present invention will now be described with reference to the accompanying drawings. The protective scope of the present invention, however, is not limited to the embodiments herein below, but covers the invention stated in the claims and equivalents thereof. The present invention is not limited to flash memory, but a flash memory is used as an example in the description of the following embodiments.

Figure 1A:
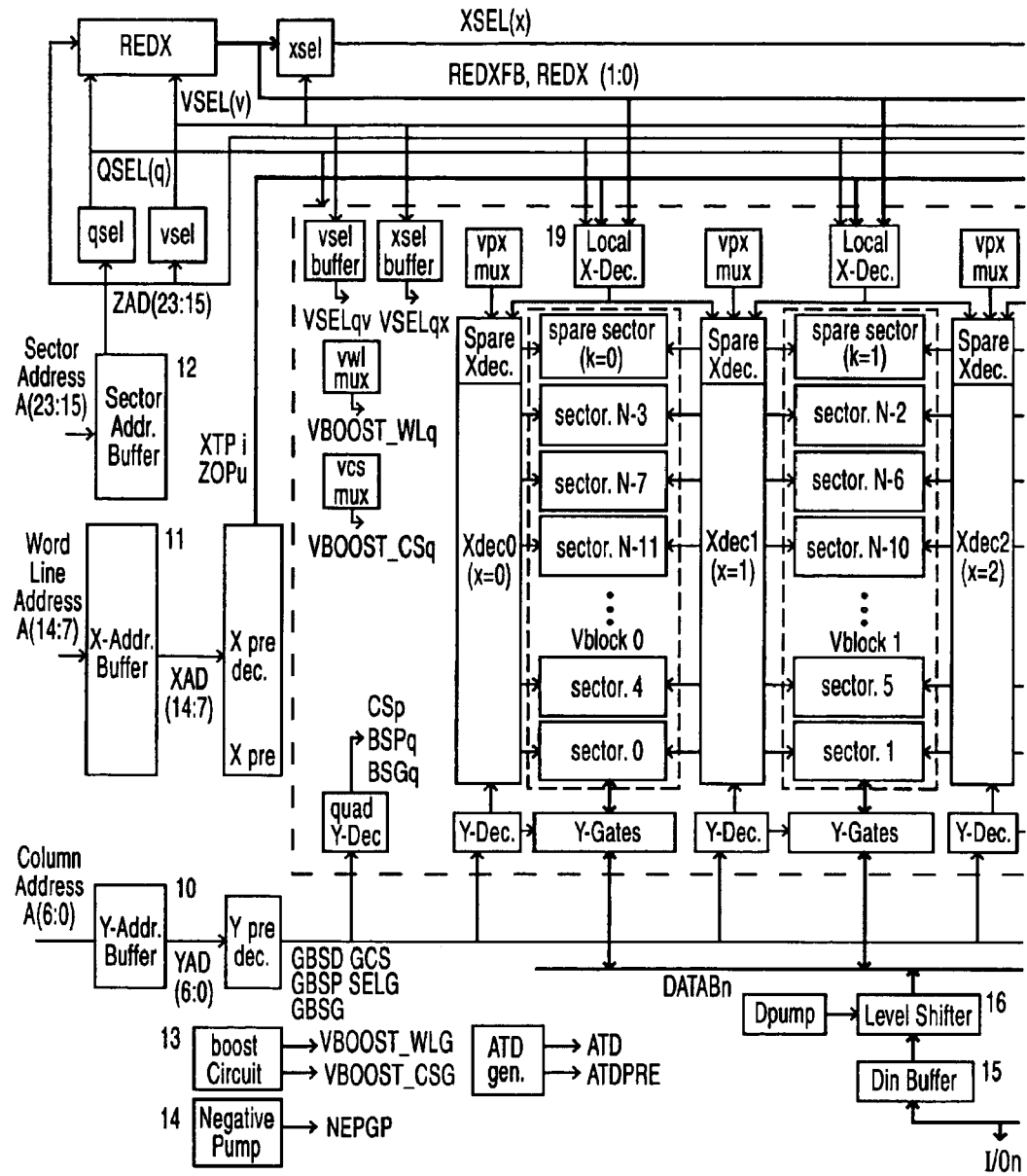
FIG. 1 is a diagram depicting a general configuration of the flash memory according to the present embodiment.
Figure 1B:
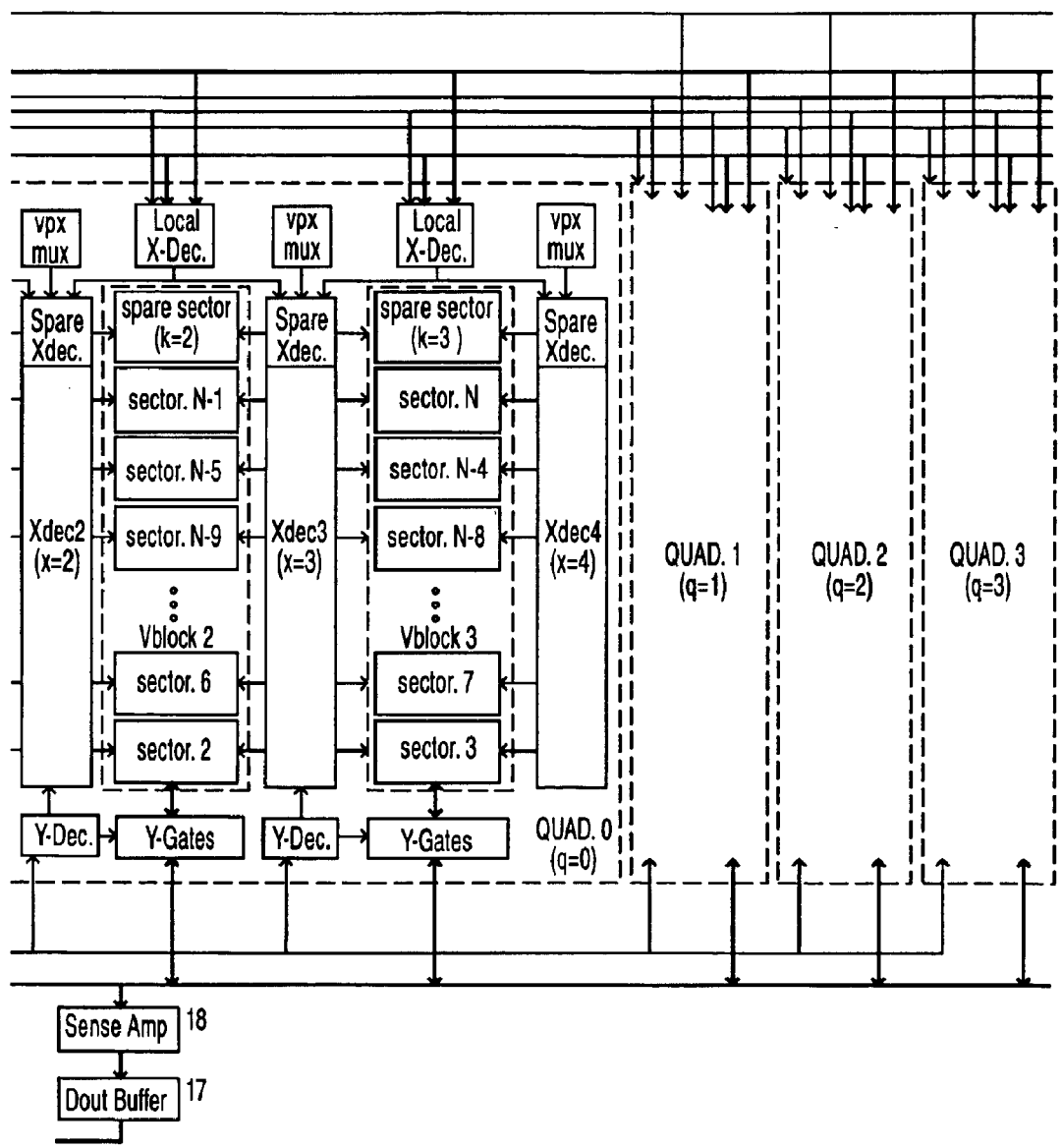

FIG. 1 is a diagram depicting a general configuration of a flash memory in the present embodiment. FIG. 1 is divided into FIG. 1A and FIG. 1B. Addresses A0–A23 are supplied to this flash memory, wherein the addresses A0–A6 are column select addresses, addresses A7–A14 are word line select addresses, and addresses A15–A23 are sector select addresses. Each address is input to the respective address buffers 10, 11 and 12, and supplied to the internal circuit as column select address YAD (6:0), word line select address XAD (14:7), and sector select address ZAD (23:15) respectively.

In each signal, q indicates a signal in quad units, and v indicates a signal in vertical block units. Q indicates a signal related to a quad block, V indicates a signal related to a vertical block, and X indicates a signal related to the X decoder. In this description, q and v may be omitted.

A memory cell array is divided into sector units. And the memory cell array is separated into vertical blocks Vblock 0–3, which comprises a plurality of regular sectors and spare sectors for repairing defects. The memory cell array is also separated into four quad blocks Quad 0–3, which have four vertical blocks respectively. In the present example, not illustrated all of them, 32 regular sectors and one spare sector are disposed in the vertical block, and in the cell array in the sector, 256 word lines and 128 bit lines are disposed, and memory cell transistors are disposed at intersecting positions thereof. Each sector has 256 word lines, and the sectors in the vertical block share 128 main bit lines.

The regular sectors and word lines in the regular sectors are selected by the X decoders Xdec 0–4, which are disposed at the left and right of the vertical blocks, and the spare sectors and word lines in the spare sectors are also selected by the X decoders for a spare Xdec, which are disposed at the left and right of the vertical blocks. Therefore the local X decoders 19 supply pre-decode signals, for selecting a sector and selecting a word line, to a necessary X decoder. The bit lines in each vertical block Vblock 0–3 are selected by the Y gate Y-Gate disposed in each vertical block. Along with this, the Y decoder Y-Dec supplies the select signal of the Y gate to the Y gate Y-Gate.

Each Y gate Y-Gate is connected to the sense amplifier 18 via the data bus DATABn, and is then connected to the input/output terminal I/On via the data output buffer 17. The input/output terminal I/On is connected to the data bus DATABn via the data input buffer 15 and level shift circuit 16.

From the sector select address ZAD(23:15), four quad select signals QSEL and four vertical block select signals VSEL are generated by the respective select signal generation circuits vsel and qsel. The five X decoder select signals XSEL for selecting the five X decoders X-dec 0–4, which are disposed on both sides of the vertical blocks, are also generated by the select signal generation circuit xsel based on the sector select address. The four quad select signals QSEL are supplied to each quad block Quad 0–3. The vertical block select signal VSEL and the X decoder select signal XSEL are decoded by the corresponding buffer circuits vsel-buffer and xsel-buffer disposed in each quad block based on the quad select signal QSEL, and become four vertical block select signals VSELqv and five X decoder select signals XSELqx in each quad block. Using these select signals VSELqv and XSELqx, pre-decode signals are distributed to the X decoder circuits. This will be described later.

The memory circuit comprises a boost circuit 13 for generating the word line boost power supply VBOOST-WLG and column boost power supply VBOOST-CSG. These boost power supplies are selected by the quad select signal QSEL in the word line boost power supply distribution circuit vwl-mux and the column boost power supply distribution circuit vcsmux in each quad block. And these selected boost power supplies VBOOST-WLq and VBOOST-CSq are distributed to the corresponding X decoders by the boost power supply distribution circuit vpx-mux disposed for each X decoder circuit according to the X decoder select signal XSELqx. Also the column boost power supply VBOOST-CSq is supplied to the Y decoder Y-dec and is used for boosting the Y gate select signal. The memory circuit also has a deboost circuit 14 for generating the word line deboost power supply NEPGP which is used for erasing.

The memory circuit also has a function to repair a defective regular sector in the vertical block by replacing it with a spare sector. For this, the memory circuit has a redundancy judgment circuit REDX for storing the address of the defective regular sector (hereafter called redundant address) and comparing it with the supplied sector address ZAD(23:15). This redundancy judgment circuit REDX generates the redundancy judgment signal REDXFB and the vertical block redundancy judgment signal REDX(1:0), which are supplied to the X decode signal generation circuit xsel and the local X decoder Local-X-dec.

Figure 2A:
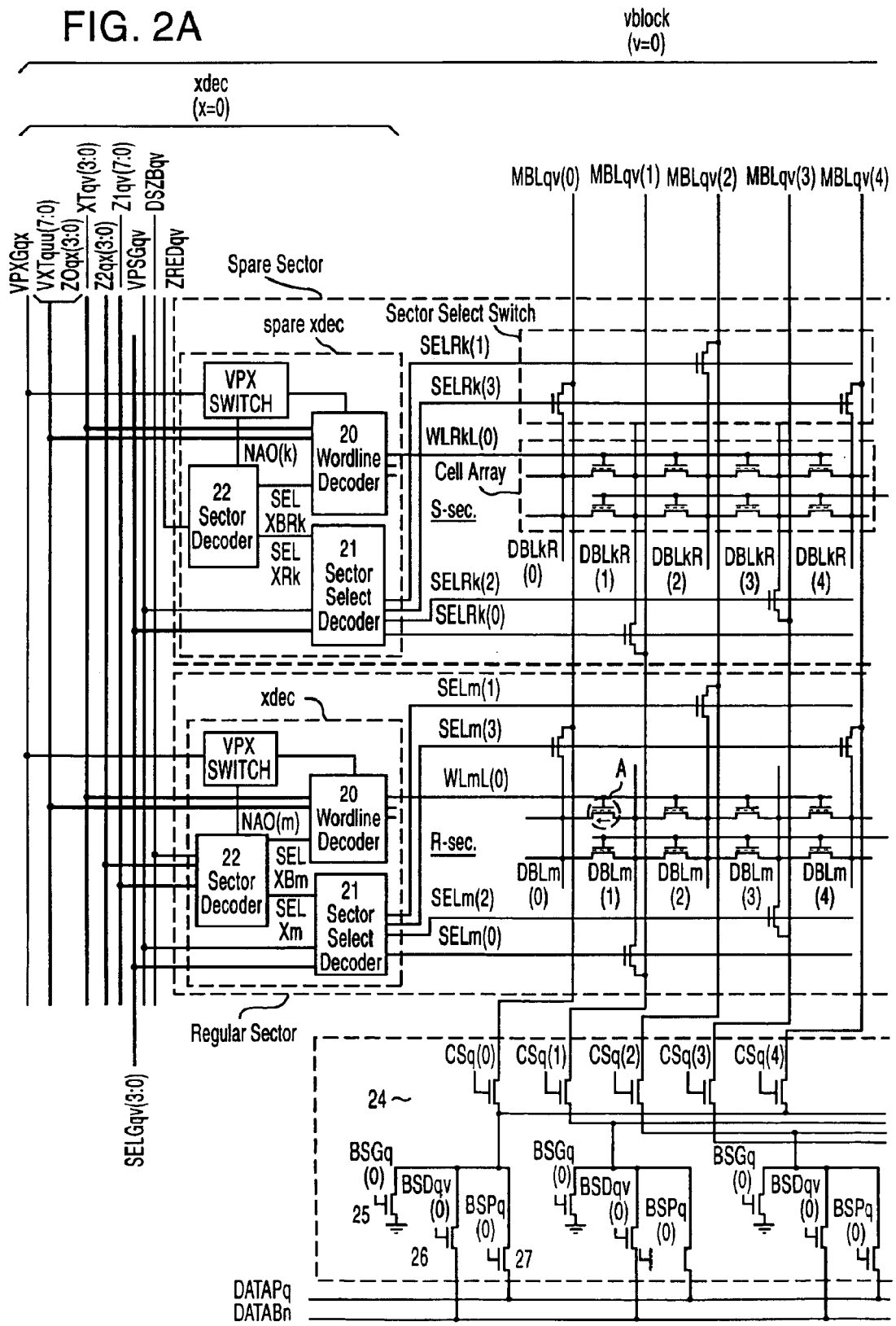
FIG. 2 is a detailed circuit diagram depicting a vertical block and X decoders at the left and right.
Figure 2B:
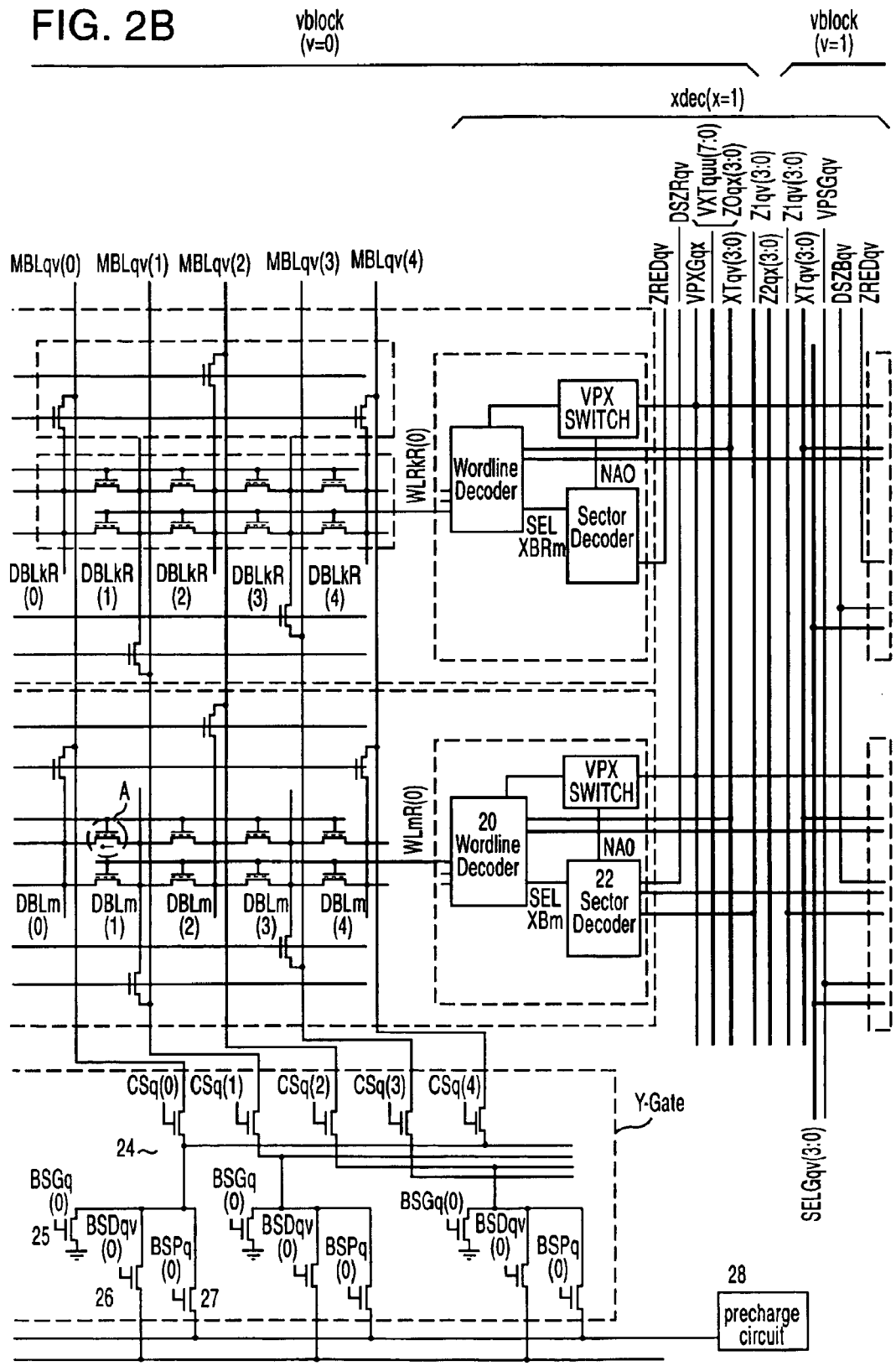

FIG. 2 is a detailed circuit diagram depicting the vertical block and X decoders at the left and right thereof. FIG. 2 is divided into FIG. 2A and FIG. 2B. FIG. 2 shows the vertical block Vblock 0 and X decoders X-doc 0 and 1 at the left and right thereof, and also shows the pre-decode signals and the boost power supply wiring to be supplied to these X decoders. In the vertical block, one regular sector R-sec and one spare sector S-sec are shown, and these sectors include regular inner word lines WLmL and WLMR, spare inner word lines WLRkL and WLRkR, and a sub-bit line DBLm in the regular sector and sub-bit line DBLkR in the spare sector, which are connected to the main bit line MBLqv via the select transistor, and cell transistors arranged at the intersecting positions thereof. The main bit line MBLqv is disposed so as to vertically cross the vertical block, and is connected to the Y gate Y-Gate.

The X decoders are disposed on both sides of the vertical block, and X decoders for regular sector are disposed on both sides of the regular sector R-sec, and X decoders for spare sectors spare-xdec are disposed on both sides of the spare sector S-sec. The X decoder for regular sectors xdec at the left comprises a word line decoder 20, a sector select decoder 21 for selecting a select transistor, a sector decoder 22 for selecting a sector, and a boost power supply switch circuit VPX-SWITCH for transferring the word line boost power supply. This is the same for the X decoder for the spare sector at the left. The decoder for regular sector at the right is comprised of a word line decoder 20, sector decoder 22, and boost power supply switch circuit VPX-SWITCH, and does not have a sector select decoder. This is the same for the X decoder for the spare sector at the right.

The sector decoder 22 at the regular sector side inputs the sector decode signals Z1 and Z2 and the regular sector disable signal DISZB; and decodes the pre-decode signals Z1 and Z2 when the regular sector disable signal DISZB is in disable status, so as to enable (activate) the corresponding word line decoder 20, sector select decoder 21 and boost power supply switch circuit VPX-SWITCH if the sector is selected, and so as to disable (deactivate) these if the sector is not selected. The sector decoder 22 at the spare sector side, on the other hand, becomes spare sector select status when the spare sector enable signal ZRED is in enable status, so as to enable the corresponding word line decoder 20, sector select decoder 21 and boost power supply switch circuit VPX-SWITCH.

The sector select decoder 21 selects four sets of select switch select signals SELRk, SELM, and connects the four sets of sub-bit lines DBL to the main bit line MBL. The decode signal for select SELG and boost power supply VPSG are supplied to the sector select decoder 21. And the word line decode signals XT, ZO and VXT and boost power supply VPXG are supplied to the word decoder 20.

The Y gate Y-Gate comprises a column switch group 24 controlled by the column switch signal CSq, and switch groups 25, 26 and 27 for connecting the main bit line MBL to ground potential or to the pre-charge bus line DATAPq or the data bus line DATABn. Three sets of these switch groups are set for connecting the three main bit lines MBL, which are selected by the column switch group 24, to the above three statuses.

Therefore in the selected cell transistor, one sub-bit line becomes ground potential, and the other sub-bit line is connected to the data bus line DATABn via the main bit line. The data bus line is connected to the sense amplifier and the input/output circuit, as shown in FIG. 1. The sub-bit line of the adjacent cell transistor, which is adjacent to the select cell transistor, is maintained at pre-charge level, so that the adjacent cell transistor does not supply the cell current to the main bit line which is connected to the sense amplifier. In other words, the cell transistor has a virtual bit line type cell array where bit lines are disposed on both sides of the cell transistor.

The cell transistor either has a floating gate or a trap gate, and stores data by the change of threshold voltage when electric charges are injected. The word line is set to the negative-potential and the bit line is set to the positive potential, to erase the data by dissipating the electric charges.

Figure 3:
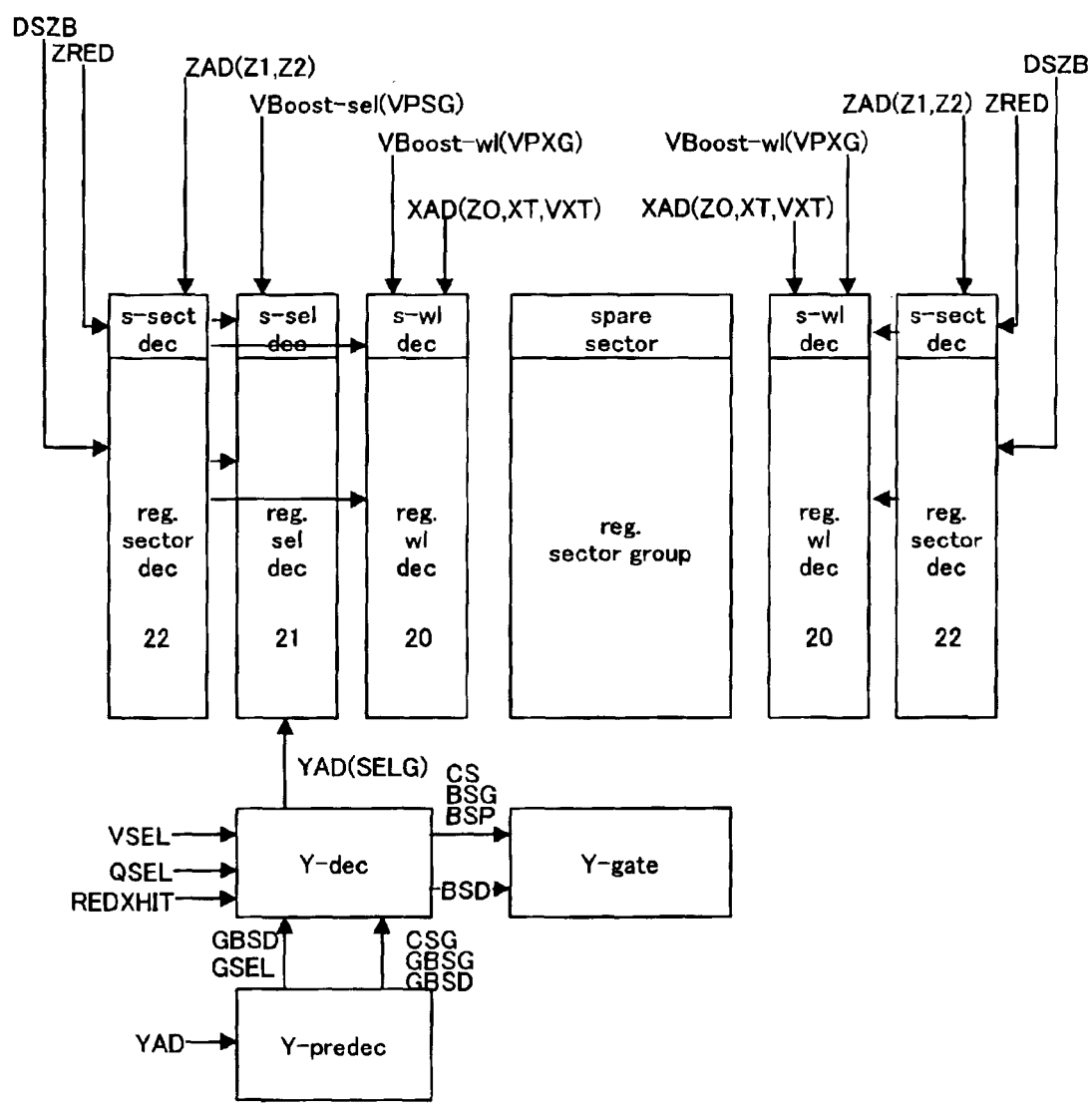
FIG. 3 is a block diagram depicting one vertical block and X decoders at both sides thereof.

FIG. 3 is a block diagram depicting one vertical block and X decoders on both sides thereof. FIG. 3 shows each decoder and pre-decode signals to be supplied thereto. In other words, FIG. 3 shows what kind of pre-decode signal and boost power supply are supplied to the word line decoder 20, sector select decoder 21 and sector decoder 22 in the X decoder. FIG. 3 also shows the Y decoder Y-dec which supplies select signals to the Y gate and the pre-decode signals to be supplied thereto. FIG. 3 also shows that the decode signal SELG to the sector select decoder 21 is supplied from the Y decoder.

The various pre-decode signals to be supplied to the X decoder are supplied only to the necessary X decoders to save power. Also to keep capability of the boost circuit low, the boost power supply is also supplied to the necessary X decoders and Y decoders. Therefore these pre-decode signals are distributed by the local X decoder, Y decoder and boost power supply distribution circuit vpx-mux according to the quad select signal QSEL, the vertical block select signal VSEL and the X decoder select signal XSEL. This distribution will be described later. In the vertical block, a word line in the sector is selected by the word line decoder 20, and a select signal is generated by the sector select decoder 21 in the sector selected by the sector decoder 22. The word line is selected by the word line decoders 20 on both side. Therefore the sector decoders 22 are also disposed on both sides.

Figure 4:
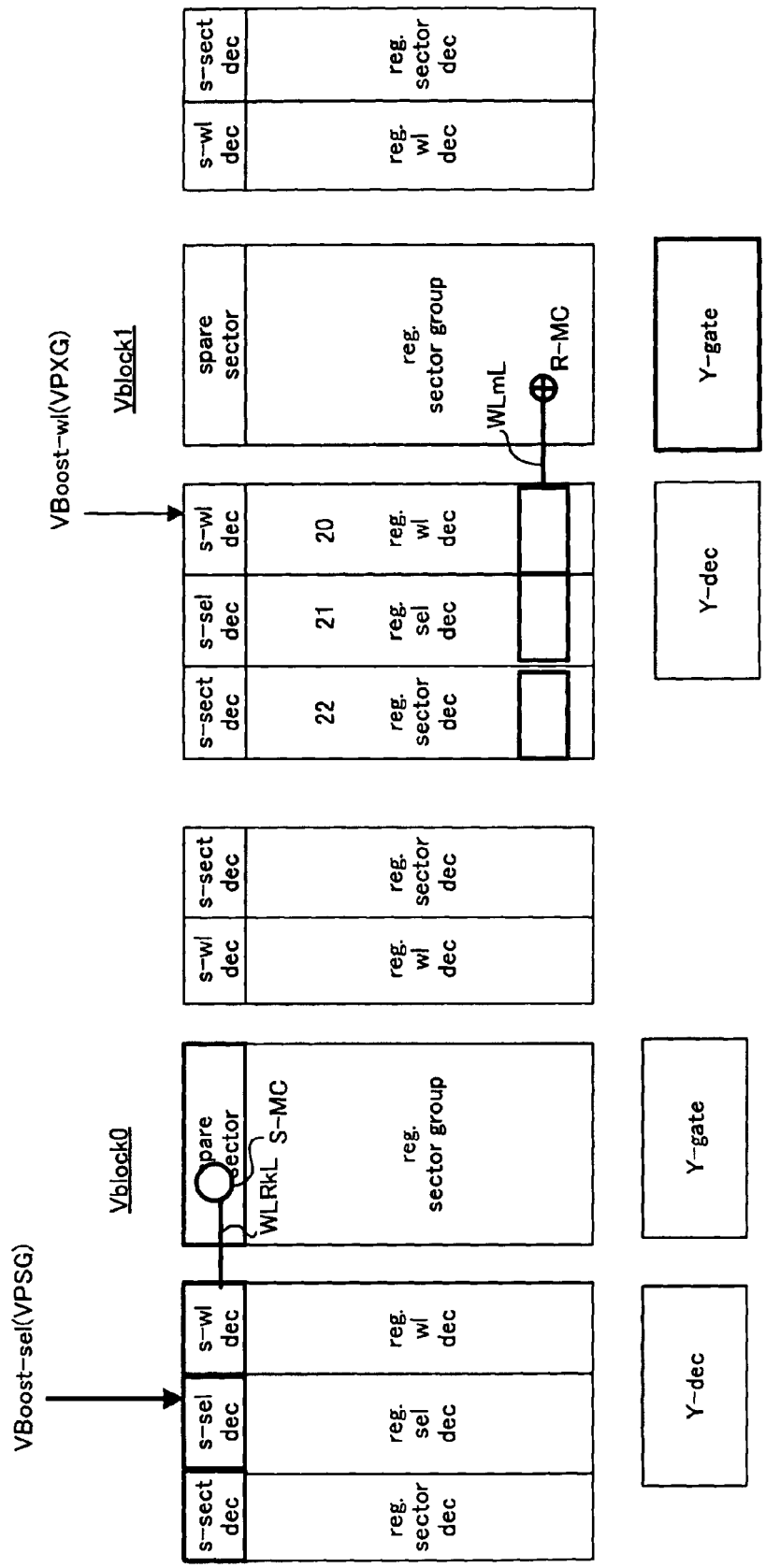
FIG. 4 is a diagram depicting the sector select operation, which is a first feature of the present embodiment.
Figure 5:
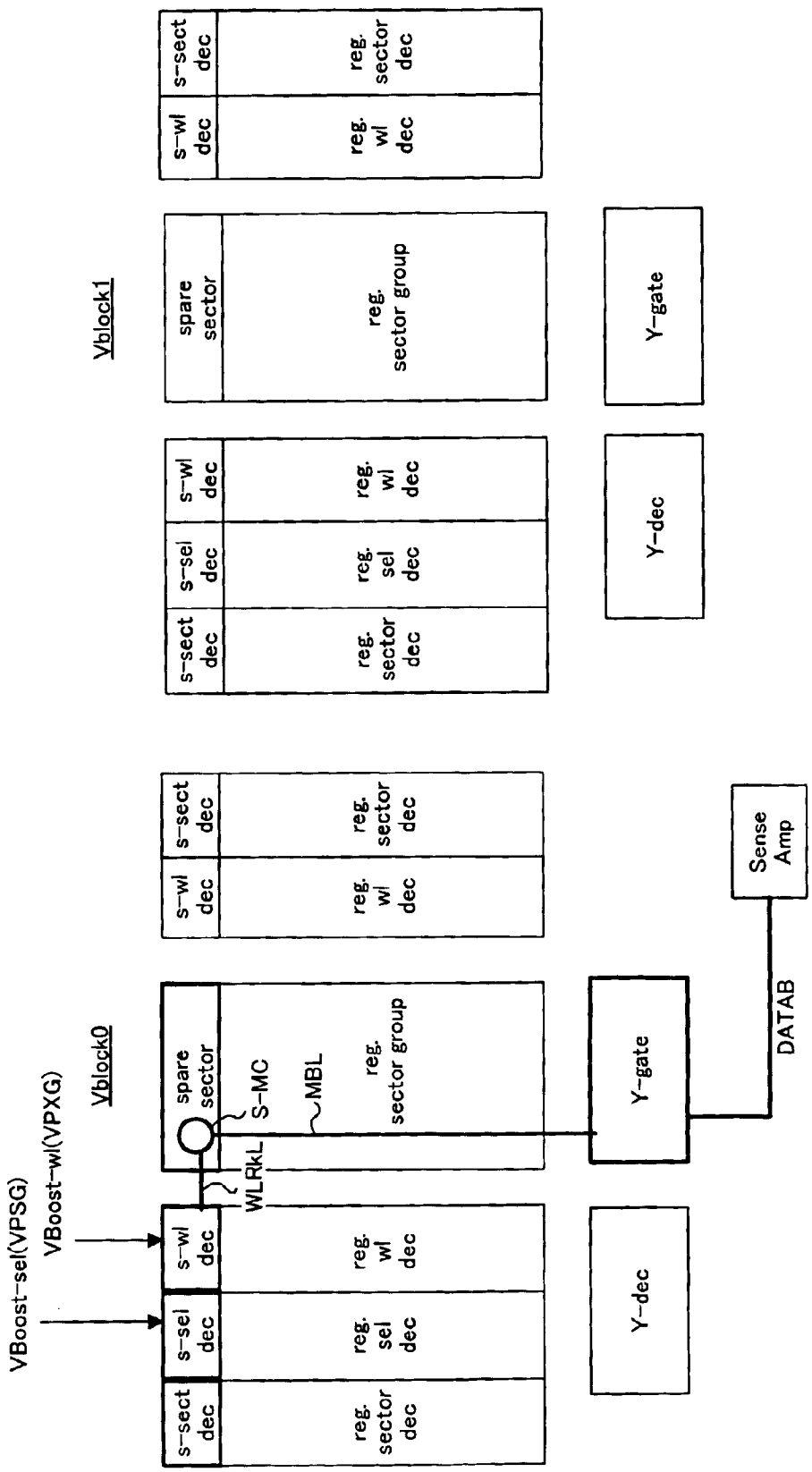
FIG. 5 is a diagram depicting the sector select operation, which is a first feature of the present embodiment.
Figure 6:
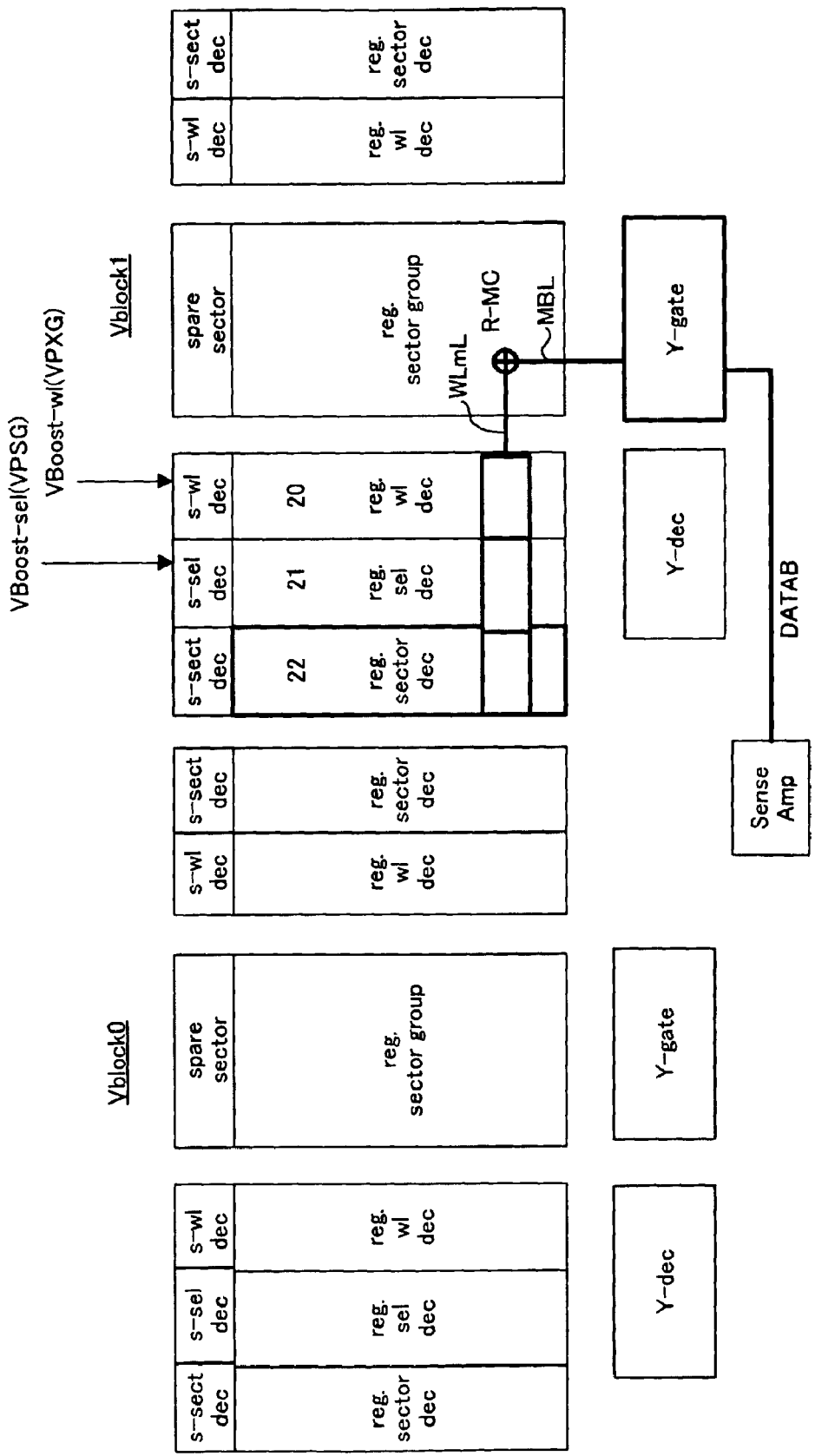
FIG. 6 is a diagram depicting the sector select operation, which is a first feature of the present embodiment.

FIGS. 4, 5 and 6 are diagrams depicting the sector select operation, which is a first feature of the present embodiment. An outline of the sector select operation will be described according to these diagrams. Then specific examples thereof will be described in detail. FIGS. 4, 5 and 6 show a pair of vertical blocks Vblock 0 and 1, decoder groups on both sides thereof, and Y gate. The decoder circuits to be activated or enabled are indicated by a bold line frame. FIG. 4 shows the operation in the first period, which is immediately after an address is supplied, and FIGS. 5 and 6 show the operation after the first period.

First, as FIG. 4 shows, the regular sector having a defective cell in the vertical block Vblock 1 is replaced with the spare sector in an adjacent vertical block Vblock 0, which is in a pair relationship with the vertical block Vblock 1. On the other hand, the defective regular sector in the vertical block Vblock 0 is replaced with the spare sector in an adjacent vertical block Vblock 1, although this is not illustrated.

Then as a result of replacement with a spare sector, the regular sector to be selected and the spare sector which may possibly replace the regular sector can be selected simultaneously only during a predetermined period after responding to the address in the read operation. FIG. 4 shows this status. Then according to the redundancy judgment result, selection of either one of the sectors is maintained or ended. FIGS. 5 and 6 show this status. By this, a decrease in the read access speed due to redundancy judgment operation is avoided.

When a new address is supplied as shown in FIG. 4, the word line WLmL of the regular sector in the vertical block Vblock 1 selected by the supply address and the word line WLRkL of the spare sector in the adjacent vertical block Vblock 0, which is in a pair relationship with the vertical block 1 of that sector, are simultaneously driven during a predetermined period. Therefore in the vertical block Vblock 1, the sector decoder 22 is in enable status and selects a corresponding regular sector, and along with this, the sector select decoder 21 and the word line decoder 20 of the selected sector are enabled. In the vertical block Vblock 0, the sector decoder at the spare side is enabled and selects a spare sector, and along with this, the corresponding sector select decoder s-sel dec and the word line decoder are enabled.

During this predetermined period, one of the Y gates is selected. In the example in FIG. 4, the Y gate at the regular sector side is in selected status.

When the above mentioned predetermined period elapses, the word line select status in either the regular sector or the spare sector, is maintained according to the redundancy judgment result, and the word line select status in the other sector ends. FIG. 5 shows the case when the redundancy judgment result is a match, where the word line WLRkL select status at the spare sector side is maintained, and the memory cell S-MC in the spare sector is connected to the sense amplifier via the main bit line MBL and the Y gate Y-Gate. At this time, the word line select status at the regular sector side ends. Also the Y gate at the vertical block Vblock 0 side is in select status because of the redundancy judgment result.

FIG. 6 shows the case when the redundancy judgment result is a mismatch, where the word line WLmL select status at the regular sector side is maintained, and the memory cell R-MC thereof is connected to the sense amplifier via the main bit line MBL and the Y gate Y-Gate. At this time, the word line select status at the spare sector side ends.

In a conventional operation, the word line at the regular sector side is driven responding to the supplied address, and after the match status is detected in the redundancy judgment, the spare sector in the same vertical block is selected and the regular sector is disabled. Whereas to enable the above mentioned simultaneous select operation, in the present embodiment, the word line decoder signal and the pre-decode signal of the sector select gate must first be supplied not only to the X decoder of the first vertical block Vblock 1, corresponding to the supplied address, but also to the X decoder of the second vertical block Vblock 0, which is a pair thereof. Secondly, the spare sector enable signal ZRED of the second vertical block Vblock 0, which is a pair of the first vertical block Vblock 1, must be temporarily enabled. And when the match status is detected in the redundancy judgment, the select target block must be changed from the first vertical block Vblock 1 to the second vertical block Vblock 0. By changing this select vertical block, the supply of the necessary boost power supply can be switched and the spare sector can be selected while maintaining a conventional operation. Considering the above mentioned changes, a specific configuration will now be described.

FIG. 7 is a diagram depicting the vertical block select signal buffer circuit. The quad select signal generation circuit qsel generates four quad select signals QSEL from the sector select address ZAD (22:23), and the vertical block select signal generation circuit vsel generates four vertical block select signals VSEL from the sector select address ZAD (15:16). And the vertical block select signal buffer circuit vsel-buffer, disposed in each quad block, generates four vertical block select signals VSELqv from the combination of the select signals QSEL and VSEL.

A later mentioned redundancy judgment signal REDXFB is supplied to this buffer circuit, and when the redundancy judgment result becomes a match status, selection of a pair of vertical blocks is switched. In the case of the example in FIGS. 4–6, for example, the select status of the vertical block Vblock 0, selected by the address, is changed to the select status of the second vertical block Vblock 1, which is a pair thereof. Therefore the vertical block select signal VSELqv is a select signal reflecting the redundancy judgment result. By using this select signal VSELqv, the necessary operation to switch to the spare sector is enabled. Specific details will be described later.

The vertical block select circuit vsel sets all of the four vertical block select signals VSEL to select status when the address ZAD(15:16) is (1, 1), responding to the simultaneous erase mode signal FCERB, which is generated by the state machine of the flash memory. By this, the sectors in the four vertical blocks can be erased simultaneously. In the case of the example in FIG. 1, four sectors 0–3, which are arranged horizontally, are simultaneously selected, and the four sectors can be erased simultaneously. The address ZAD(15:16) sequentially changes from (1, 1) to (0, 0), so the four sectors are simultaneously erased when the address ZAD(15:16) is (1, 1), and erase processing ends by simply passing verification in (1, 0)–(0, 0). This can decrease the erase time.

In the present embodiment, if a regular sector is defective, the regular sector is replaced with a spare sector in the adjacent vertical block. Therefore, in this case four sectors arranged in a horizontal direction cannot be erased simultaneously. Therefore if the redundant address matches in one of the four vertical blocks, the above mentioned four sector simultaneous erase mode must be disabled. For this, the simultaneous erase mode disable signal DISFCERB generated by the later mentioned redundant circuit is supplied to the select signal generation circuit vsel.

FIG. 8 is a diagram depicting the address transition detection circuit and the operation timing chart thereof. The address transition detection circuit ATD-gen detects the change of addresses XAD, YAD and ZAD, and generates the address transition detection signal ATD which has a predetermined pulse width. When this address transition detection signal ATD becomes L level, the word line boost power supply VBOOST-WLG and the column boost power supply VBOOST-CSG are boosted to a voltage higher than the power supply Vcc. The address transition detection circuit ATD-gen also generates the second address transition detection signal ATDPRE, which pulse width is shorter than the address transition detection signal ATD. The second address transition detection signal forcibly sets the redundancy judgment signal REDXFB to a match status (L level) during the H level period, as shown in FIG. 8, and after the H level period ends, the second address transition detection signal sets the redundancy judgment signal REDXFB to a status according to the original judgment result. By this, selection of the spare sector during the H level period is enabled. This operation is clarified by the later mentioned redundancy judgment circuit.

Figure 9:
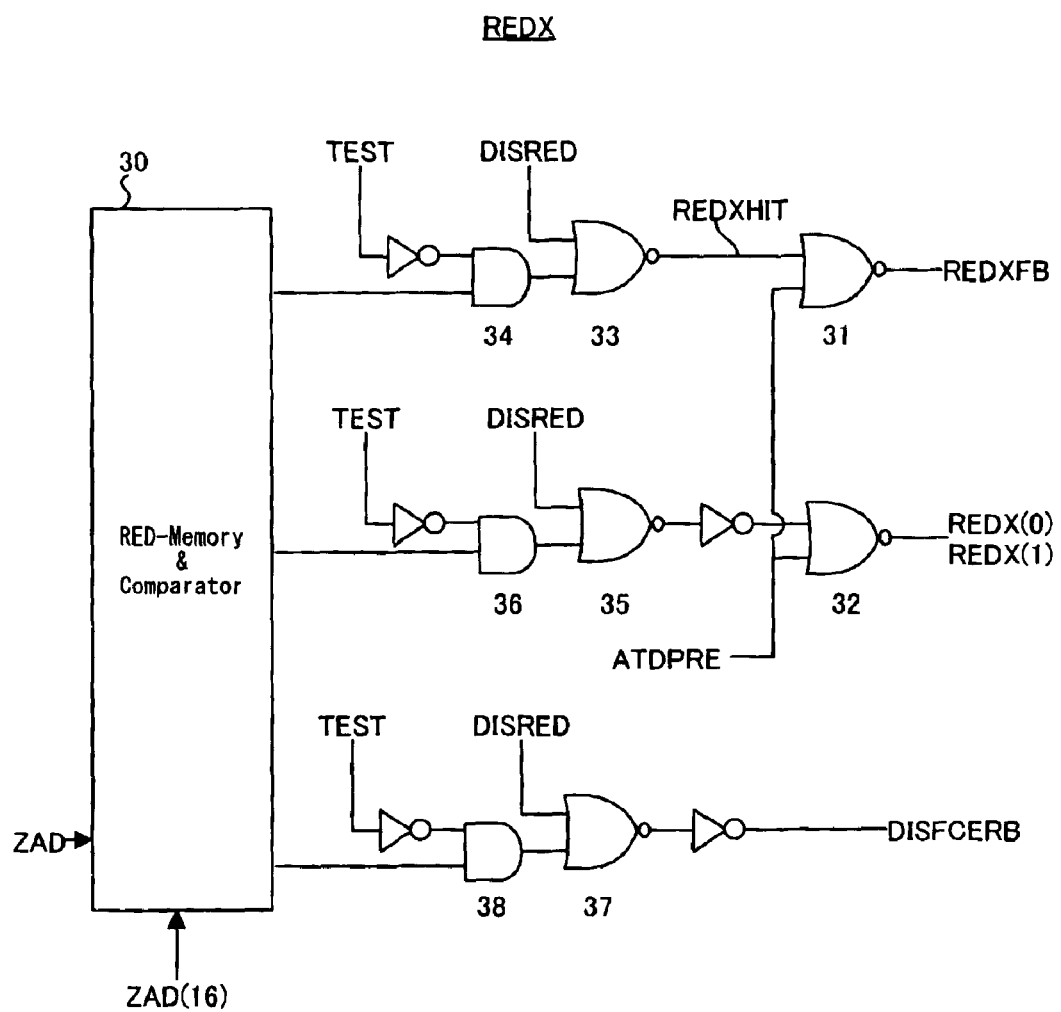
FIG. 9 is a diagram depicting the redundancy judgment circuit.

FIG. 9 is a diagram depicting the redundancy judgment circuit. The redundant memory and comparison circuit 30 is comprised of a redundant memory for storing a defective sector address in each vertical block, a memory to indicate whether the defective sector address is valid or not, and a comparison circuit for comparing the stored defective sector address and the sector select address to be supplied. For the redundant memory, a non-volatile memory, the same as one used for a memory cell, is used.

The redundancy judgment circuit REDX generates a redundancy judgment signal REDXFB when the defective sector address of the selected vertical block and the supplied sector address ZAD are matched (L level when matched), a vertical block redundancy judgment signal REDX(0) when the defective sector address of the vertical block Vblock 0 and 2 and the supplied sector address ZAD are matched (H level when matched), a vertical block redundancy judgment signal REDX(1) when the defective sector address of the vertical block Vblock 1 and 3 and the supplied sector address ZAD are matched (H level when matched), and a simultaneous erase mode disable signal DISFCERB when the defective sector address of one of the vertical blocks and the supplied sector address ZAD are matched (L level when matched).

Also the redundancy judgment signals REDXFB and REDX(0), (1) are forcibly set to REDXFB=L (matched status) and REDX(0), (1)=L (not matched status) by the second address transition detection signal ATDPRE (=H level) via the NOR gates 31 and 32. In other words, when an address transition occurs, the redundancy judgment signal REDXFB is set to pseudo-matched status. Using this, the spare sector in the adjacent second vertical block can be enabled, as described later.

Figure 10:
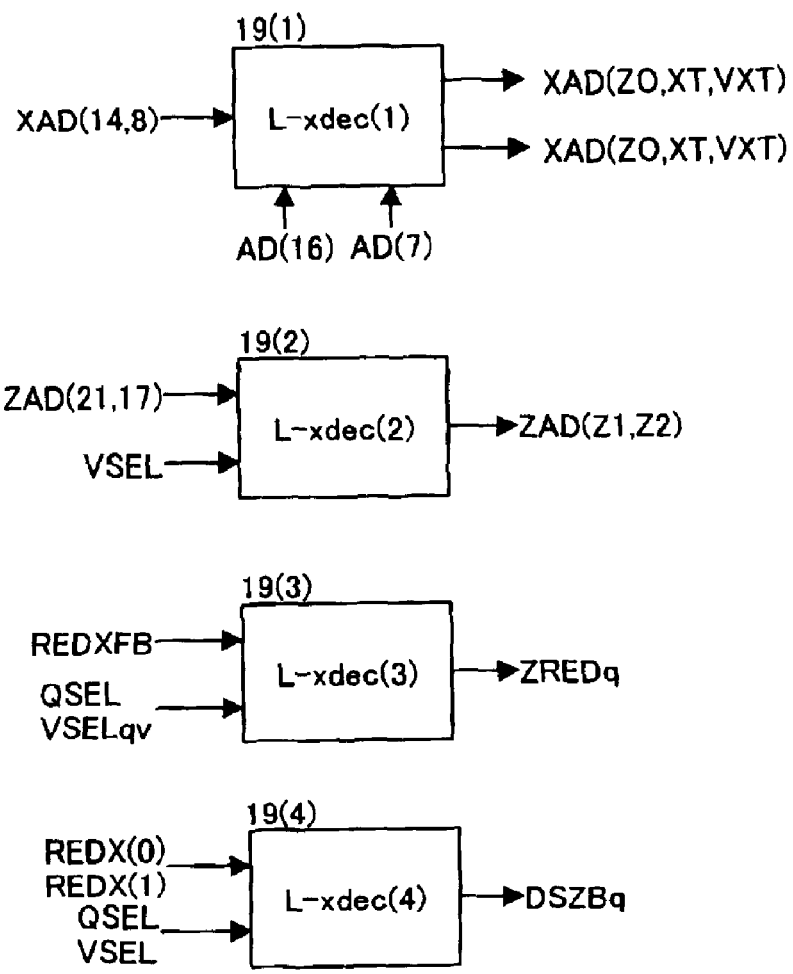
FIG. 10 is a diagram depicting the configuration of the local X decoder.

FIG. 10 is a diagram depicting the configuration of the local X decoder, and FIG. 11 is a diagram depicting the configuration of the boost power supply distribution circuit. By these circuits, the pre-decode signal and the enable signal to be supplied to the X decoder and the boost power supply are distributed to the necessary locations, enabling the simultaneous selection of word lines and selecting and switching of a vertical block when the redundancy judgment is in a match status.

The local X decoder 19 (1) is a circuit for distributing the pre-decode signals ZO, XT and VXT to be supplied to the word line decoder, and is shown including the X pre-decoder function in FIG. 10. In other words, the pre-decode signals at the word line select address XAD(14:8) are divided into a signal group to be distributed to the X decoders of the two left side blocks Vblock 0 and 1, and a signal group to be distributed to the X decoders of the two right side blocks Vblock 2 and 3, depending on the address AD(16) which distinguishes the two blocks Vblock 0 and 1 at the left and the two blocks Vblock 2 and 3 at the right of the four vertical blocks in the quad block, and a signal group at the selected vertical block side are distributed. The address AD(7) is a signal to distinguish whether the word line decoder to select a word line is at the left side or the right side of the block, and is used for distributing partial pre-decode signals VXT. This distribution can be executed using the vertical block select signal VSEL, or using the later mentioned X decoder select signal XSEL.

The local X decoder 19 (2) pre-decodes the sector address ZAD(21:17) and distributes the pre-decode signals Z1 and Z2 only to the X decoders of the vertical block selected by the address according to the vertical block select signal VSEL. The vertical block select signal VSEL is a select signal, which is not influenced by the redundancy judgment result, and the pre-decode signals Z1 and Z2 to be supplied to the sector decoder 22 are supplied only to the vertical block selected by the supplied address, and are not supplied to the spare sector of the vertical block which is a pair thereof.

The local X decoder 19 (3) generates the spare sector select signal ZREDq to the vertical block selected by the quad select signal QSEL and the vertical block select signal VSELqv, when the redundancy judgment signal REDXFB becomes a match status. The vertical block select signal VSELqv is a signal which is switched by the influence of the redundancy judgment result signal REDXFB. Therefore in the period when the address transition detection signal ATDPRE is output, the redundancy judgment result signal REDXFB is forcibly set to L level (match status), so the vertical block select signal VSELqv selects the adjacent vertical block, which is a pair of the vertical block selected by the supplied address. In other words, in the case of the example in FIG. 4, the vertical block select signal VSELqv selects the vertical block Vblock 0. Therefore while the second address transition detection signal ATDPRE is at H level, the spare sector select signal ZREDq in the adjacent vertical block Vblock 0 is in selected status, enabling simultaneous selection of word lines.

The local X decoder 19 (4) generates the sector disable signal DSZBq to the vertical block which is selected by the quad select signal QSEL and the vertical block select signal VSEL, when the redundancy judgment result becomes a match status. That is, when the redundancy judgment result is a match status, the regular sector selected by the supply address is set to non-selected status and the spare sector is set to selected status. That is, in the example in FIG. 4, the sector disable signal DSZBq of the selected block Vblock 1 becomes enabled status first by the vertical block select signal VSEL, but then becomes disable status because of the redundancy judgment result.

Now the boost power supply distribution circuit in FIG. 11 will be described. FIG. 11 shows the X decoder select signal generation circuit xsel and the buffer circuit xsel-buffer thereof in the previous stage of the boost power supply distribution circuit vpx-mux(1). The X decoder select signal generation circuit xsel generates five X decoder select signals XSEL from the four vertical block select signals VSEL using the address signal AD(7). In the buffer circuit xsel-buffer disposed in each quad block, five X decoder select signals XSELq are generated by determining AND for the five X decoder select signals XSEL with the quad select signal QSEL, and the word line boost power supply VPXG is distributed by the distribution circuit vpx-mux(1). In other words, the boost power supply VPXG is supplied only to one of the five X decoders.

When the redundancy judgment result becomes a match status, according to the redundancy judgment signals REDX (0), (1), however, the supply destination of the word line boost power supply VPXG is changed to the X decoder of the block at the spare sector side depending on the position of the vertical block. According to the examples in FIG. 4, FIG. 5 and FIG. 6, the word line boost power supply VPXG is supplied to the X decoder at the left side of the vertical block Vblock 1 during a predetermined period after address transition is detected, but if the redundancy judgment result is a match, the X decoder at the left side of the vertical block Vblock 1 is changed to the X decoder at the left side of the vertical block Vblock 0, and is not changed if the redundancy judgment result is a mismatch.

Another boost power supply distribution circuit vpx-mux (2) supplies the boost power supply VPSG of the sector select gate select signal to the X decoder according to the vertical block select signal VSELqv. Since the boost power supply is distributed by the vertical block select signal VSELqv, which is influenced by the redundancy judgment result, according to the examples in FIG. 4, FIG. 5 and FIG. 6, the boost power supply VPSG is supplied to the X decoder at the left side of the vertical block Vblock 0 during a predetermined period after address transition is detected, but after this period, this status is maintained if the redundancy judgment result is a match, but the X decoder at the left side of the vertical block Vblock 0 is changed to the X decoder at the left side of the vertical block Vblock if a mismatch.

The above mentioned word line and the selector select signal are driven to the power supply Vcc level during a predetermined period while the address transition detection signal is generated, and thereafter is driven to the boost level by the boost power supply. Therefore during the predetermined period while the address transition detection signal is generated, the boost power supply can be supplied to either X decoders, only after the predetermined period is over the boost power supply should be supplied to a necessary X decoder according to the redundancy judgment result. So in the above-mentioned example, both of the boost power supplies are supplied to a necessary X decoder according to the redundancy judgment result.

In FIG. 3, in the Y decoder Y-dec, the select signal BSD for selecting the Y gate of the selected vertical block is driven by the vertical block select signal VSEL. Also using the vertical block select signal VSEL, the pre-decode signal SELG of the selector select decoder 21 is also supplied to a pair of vertical blocks. And responding to the redundancy judgment signal REDHIT from the redundancy judgment circuit, the Y gate select signal BSD is switched and supplied to the adjacent vertical block side, which is a pair thereof, if the result is a match status. If the result is a mismatch status, supply to the selected vertical block side is maintained. And the pre-decode signal SELG may remain to be supplied to a pair of vertical blocks, and the sector select decoder 21 is controlled by the sector decoder 22.

The Y gate select signal BSD generated by the Y decoder Y-dec is boosted by the column boost power supply VBOOST-CS at the quad Y decoder quad-Y-dec in FIG. 1, and is supplied only to the Y gate of a block at one side of the pair of vertical blocks at the Y decoder Y-dec according to the redundancy judgment signal REDXHIT.

In the above description, the simultaneous selection of the regular sector and the spare sector and the select operation thereafter according to the redundancy judgment result in the present embodiment have been understood. Now the above select operation will be described with reference to the timing chart.

Figure 12:
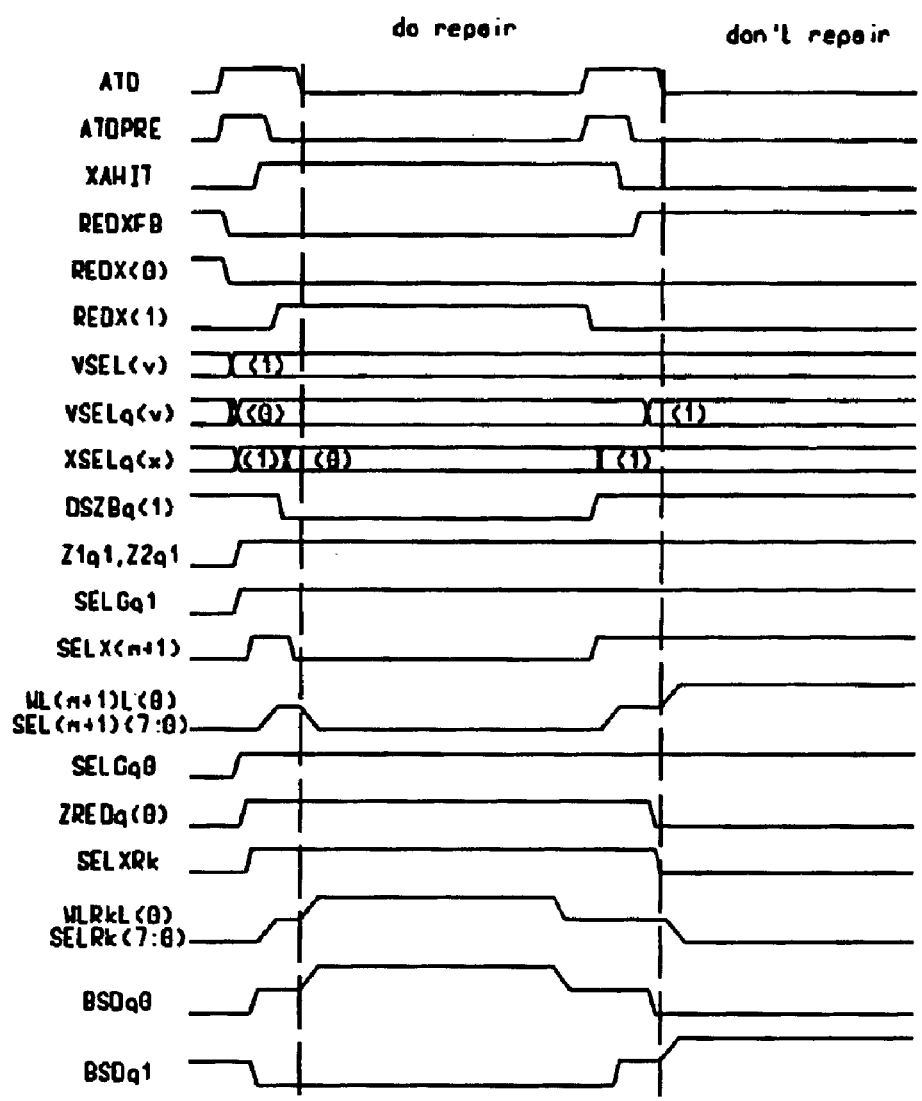
FIG. 12 is the operation timing chart according to the present embodiment.

FIG. 12 is an operation timing chart according to the present embodiment. FIG. 12 shows both cases when the address transition is detected and then the defective sector is repaired to the spare sector side ("do repair" in FIG. 12) and when the address transition is detected and then the defective sector is not repaired ("don't repair" in FIG. 12). As an example, the case when vertical block Vblock 1 is selected by the supplied address and the spare sector of the vertical block Vblock 0, which is a pair thereof, is simultaneously selected, as in FIGS. 4, 5 and 6, will be described.

At first, the case when the redundancy judgment becomes a match status and the regular sector is switched to the spare sector side will be described. When the address transition is detected first, the address transition detection signals ATD and ATDPRE become H level for a predetermined period. Responding to this, in the redundancy judgment circuit REDX (REDX(0) in this case), the redundancy judgment signal REDXFB is forcibly controlled to L level, which is a match status. Since the supplied address selects the vertical block Vblock 1, the vertical block select signal VSEL selects the block 1. The other vertical block select signal VSELqv, which is influenced by the redundancy judgment, selects the block 0. The X decoder select signal XSELq also selects the block Vblock 1.

During a predetermined period after address transition is detected, the pre-decode signals ZO, XT and VXT to the word line decoder and the pre-decode signals SELGq0 and SELGq1 to the sector select decoder are supplied to both the vertical blocks Vblock 0 and Vblock 1. And by the pre-decode signals Z1 and Z2 to the sector decoder, the regular sector at the vertical block Vblock 1 side is selected, and the word line WL(m+1)L(0) in the regular sector and the sector select signal SEL(m+1) are driven to the power supply Vcc level. At the same time, the spare sector enable signal ZREDq(0) at the vertical block Vblock 0 side is in enable status, and the word line WLRkL(0) in the spare sector and the sector select signal SELXRk are also driven to the power supply Vcc. This is the simultaneous select status.

While the address transition detection signal ATD is H level, the redundancy judgment signal REDXFB maintains a match status (L level), even if the redundancy judgment operation completes and detection signal ATDPRE becomes L level. When the redundancy judgment result is a match at the vertical block Vblock 1, the redundancy judgment signal REDX(L) becomes H level, and responding to this, the sector disable signal DSZBq(1) becomes L level and all the sector decoders at the vertical block Vblock 1 side are disabled, and the word line WL(m+1)L(0) in the regular sector and sector select signal SEL(m+1) drop to ground level. In other words, select status ends.

On the other hand, the redundancy judgment signal REDXFB is in a match status, so the vertical block select signal VSELqv maintains the block Vblock 0 select status. The X decoder select signal XSELq switches from the block Vblock 1 to the block Vblock 0. More specifically, out of the five X decoder positions, selection switches to the X decoders corresponding to these blocks. And at the vertical block Vblock 0 side to which the boost power supply is supplied, the word line WRLkL(0) in the spare sector and the sector select signal SELRk are driven to the boost power supply level. In the same way, the Y gate select signal BSDq0 is also driven from the power supply Vcc level to the boost voltage level. By this, the cell current at the spare sector side is supplied to the sense amplifier via the main bit line, Y gate and data bus line.

Now the case when the redundancy judgment result is a mismatch and the selection of the regular sector side is maintained will be described. The operation while the address transition detection signal ATDPRE is at H level is as described above. And when the redundancy judgment result becomes a mismatch, the redundancy judgment signal REDXFB becomes H level, so the vertical block select signal VSELqv is switched to the vertical block Vblock 1 side, which is selected by the supplied address. Because of this, the spare sector enable signal ZREDq(0) drops to L level, and all of the word line WLRkL(0), sector select signal SELRk and Y gate select signal BSDq 0 at the vertical block Vblock 0 side drop to ground level.

At the vertical block Vblock 1 side, on the other hand, the word line WL(m+1)L(0), sector select signal SEL(m+1) and Y gate select signal BSDq1 are driven from the power supply Vcc level to the boost power supply level.

As described above, the regular sector and the spare sector are simultaneously selected responding to the address transition, and the word line in both sectors are driven to the power supply Vcc level once, so a delay of access due to the redundancy judgment operation can be avoided.

[Prevention on Drop of Column Boost Power Supply]

The Y gate select signal BSD, column select signal CS and pre-charge select signal BSP, which are supplied to the Y gate Y-Gate shown in FIG. 2, are driven to the power supply Vcc during a predetermined period after address transition, but are also driven to the boost level by the column boost power supply VBOOST-CS after the redundancy judgment. In the same way, the sector select signal SEL is also driven.

When the quad address ZAD(23:22) changes, the quad select signal QSEL changes and selection of the quad block switches. At this time, the select signals CS, BSP, BSD and SEL, to be supplied to the Y gate, are switched. The power supply for these is the column boost power supply VBOOST-CS, which is generated by the boost circuit 13, but the problem is that this power supply largely drops due to the above mentioned simultaneous switching.

Figures 13A, 13B:
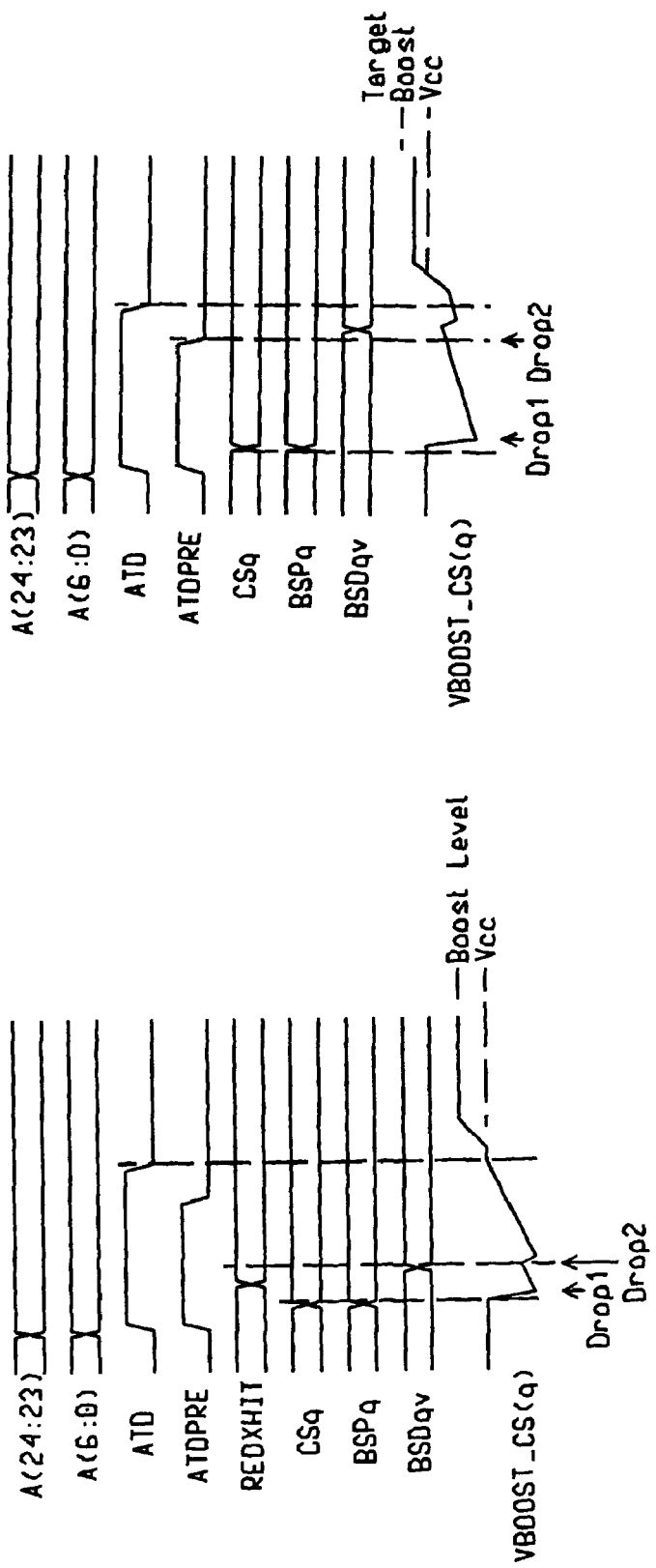
FIG. 13 is a timing chart depicting a drop in column boost power supply.

FIG. 13 is a timing chart depicting the drop of the column boost power supply. As FIG. 13B shows, the column boost power supply VBOOST-CS largely drops along with the address transition ("Drop 1" in FIG. 13B). Also the switching of the Y gate select signal BSD is controlled by the Y decoder using the redundancy judgment signal, so the Y gate select signal BSD changes at a timing slower than the other select signals CS, BSP and SEL. Along with this, the column boost power supply VBOOST-CS drops again by the change of the Y gate select signal BSD ("Drop 2" in FIG. 13B). By this second drop of the boost power supply, the column boost power supply VBOOST-CS cannot be recovered up to the power supply Vcc level during the period when the address transition detection signal ATD is at H level. If recovery is impossible, drive to the boost power supply level thereafter may become difficult. To sufficiently recover the column boost power supply to the power supply Vcc level, the pulse width of the address transition detection signal ATD is made longer, but this causes a drop of the access speed, which is not favorable.

Therefore according to the present embodiment, the signal REDXHIT, which notifies the redundancy judgment result, is fetched from the redundancy judgment circuit REDX at a timing earlier than the redundancy judgment signal REDXFB, and is supplied to the Y decoder Y-dec. In other words, as FIG. 9 shows, the premature redundancy judgment signal REDXHIT is a signal which has a premature timing before logic is determined by the address transition detection signal ATDPRE at NOR gates 31, 32. Therefore before the address transition detection signal ATDPRE becomes L level, this premature redundancy judgment signal REDXHIT can notify the redundancy judgment result. And in the Y decoder, the Y gate select signal BSD is switched using this premature redundancy judgment signal REDXHIT, as shown in FIG. 3. In other words, in the Y decoder Y-dec, selection of the Y gate is switched by the vertical block select signal VSEL and the premature redundancy judgment signal REDXHIT.

In the operation of the Y decoder Y-dec, during a predetermined period after address transition, the Y gate select signal BSD uniformly selects a block at the regular sector side, and then is switched according to the premature redundancy judgment signal REDXHIT.

As FIG. 13A shows, if the vertical block Vblock 1 is in a select status, the premature redundancy judgment signal REDXHIT becomes a mismatch status (L level) when the redundancy judgment result is a mismatch, the blocks are not switched and the Y gate select signal BSDq1 of the vertical block Vblock 1 becomes enable status before the address transition detection signal ATDPRE falls, and when the redundancy judgment result is a match, on the other hand, the signal REDXHIT becomes a match status (H level), the blocks are switched, and the Y gate select signal BSDq0 of the vertical block Vblock 0 becomes enable status before the address transition detection signal ATDPRE falls. In any case, the switching timing of the Y gate select signal BSD is quickened. As a result, the second drop timing of the column boost power supply VBOOST-CS is quickened, and the column boost power supply can sufficiently recover to the power supply Vcc level before the address transition detection signal ATD becomes L level. Therefore access time does not delay.

[Four Sector Simultaneous Erase Mode Disabled Operation]

The present embodiment has a simultaneous erase mode, in which four sectors (for example sectors 0–3) which are arranged in the horizontal direction shown in FIG. 1 are simultaneously erased at sector erase. However, a spare sector for repairing a defective regular sector is the spare sector in the adjacent vertical block to be a pair thereof. So when the defective regular sector is replaced with the spare sector, the above simultaneous erase mode is impossible. This is because the erase target regular sector and the spare sector exist in a same vertical block, so that supply of the bit line current becomes insufficient.

Figure 14:
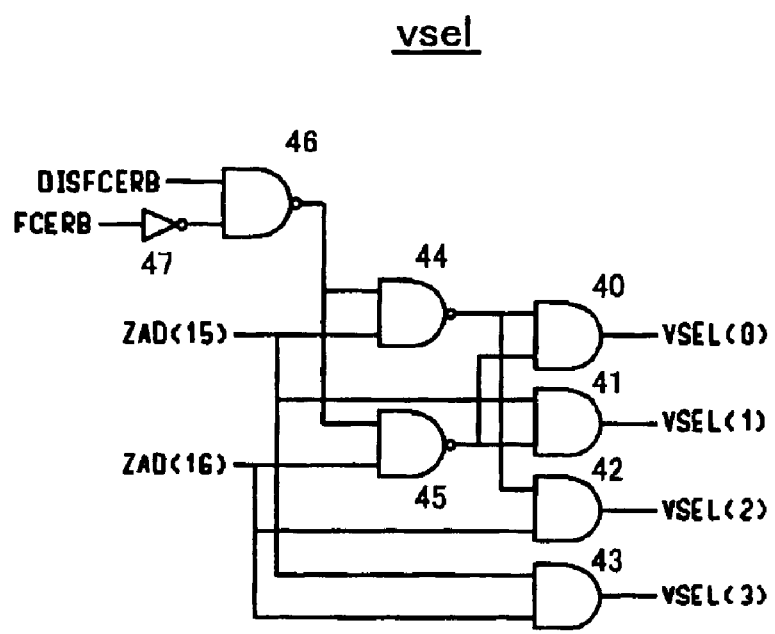
FIG. 14 is a diagram depicting the vertical block select signal generation circuit according to the present embodiment.

FIG. 14 is a diagram depicting the vertical block select signal generation circuit according to the present embodiment. FIG. 14 shows the details of the vertical block select signal generation circuit vsel shown in FIG. 7. The addresses ZAD(15) and ZAD(16) are decoded by the AND gates 40–43 and the inversion gates 44 and 45, and four vertical block select signals VSEL(0)–(3) are generated. And when the four sector simultaneous erase mode signals FCERB (L level) are supplied from the state machine of the memory via the inverter 47 and the NAND gate 46, the inversion operation of the NAND gates 44 and 45 stops, and all the four vertical block select signals VSEL(0)–(3) become select status (H level). This is simultaneous erase mode status.

On the other hand, the simultaneous erase disable signal DISFCERB, which indicates that the redundant address and supply address matched in one of the vertical blocks, is supplied to the vertical block select signal generation circuit vsel. This signal is generated by the redundancy judgment circuit REDX in FIG. 9. When this simultaneous erase disable signal DISFCERB becomes disable status (L level), the NAND gates 44 and 45 become inversion gates regardless the simultaneous erase mode signal FCERB, so normal decode operation is performed and simultaneous select is disabled.

Along with this, the address ZAD(16:15) is sequentially switched as (1, 1), (1, 0), (0, 1) and (0, 0), and each sector is sequentially erased one by one. If a sector has been repaired by a repair sector, the redundancy judgment signal REDXFB becomes a match status (L level), and the vertical block is switched, so the repair sector is erased.

[Second Embodiment]

The second embodiment will now be described. The memory circuit of this embodiment also comprises a plurality of regular sectors and spare sectors, as shown in FIGS. 1, 2 and 3, and further comprises a redundancy judgment circuit REDX, as shown in FIG. 9. And responding to the test signal TEST, which is a first signal, the redundancy judgment circuit REDX sets the redundancy judgment signal REDXFB to a match status, regardless the address in the redundant memory, and enables access to the spare sector. For this the AND gates 34, 36 and 38 are disposed. Therefore other judgment signals REDX(0), (1) are also forcibly set to match status, and the simultaneous erase mode disable signal DISFCERB is also forcibly set to a match status (disable status).

Also responding to the redundancy disable signal DISRED, which is a second signal, the redundancy judgment circuit REDX sets the redundancy judgment signal REDXFB to a mismatch status regardless the address in the redundant memory, and enables access to the regular sector which is replaced with the spare sector. For this, the NOR gates 33, 35 and 37 are disposed. Along with this, other judgment signal REDX(0), (1) are forcibly set to a mismatch status and the simultaneous erase mode disable signal DISFCERB is also forcibly set to a mismatch status (enable status).

According to this embodiment, access to the spare sector is enabled and the spare sector can be tested even before writing a redundant address to the redundant memory. Also access to the regular sector, which is replaced with the spare sector, is enabled, and the regular sector judged as defective can be tested even after writing the redundant address to the redundant memory.

In the above descriptions of embodiments, a flash memory was used as an example. However the method of the present embodiment for simultaneously selecting the regular cell array and the spare cell array temporarily, can be applicable even for a different type semiconductor memory which has a redundant cell array. Particularly in the case of a memory circuit with a redundant configuration of word lines, if the redundant judgment is match status, operation must be restarted from the selection of word lines at the spare cell array side, therefore, in such configuration, the temporary simultaneous selection is effective. When the word line and Y gate select signal are driven to the boost power supply level, driving to the boost level after redundancy judgment is over is effective, and for this, it is effective to decide whether the boost power supply is supplied, according to the redundancy judgment.

According to the present invention, a memory circuit with a redundant configuration, where a drop in access speed due to redundancy judgment is suppressed, can be provided.

What is claimed is:

1. A memory circuit having a plurality of sectors having memory cells, comprising:
   a plurality of blocks, each of which comprises a plurality of regular sectors and a spare sector,
   wherein when a regular sector in a first block out of said plurality of blocks is defective, said defective regular sector is replaced with a spare sector in a second block, and
   responding to a supplied address, the regular sector corresponding to the supplied address in said first block and the spare sector in the second block are selected simultaneously during a first period, and after said first period, selection of either said regular sector or spare sector, which are simultaneously selected, is maintained according to a result of redundancy judgment on whether the supplied address matches with a redundant address, and selection of the other ends.

2. The memory circuit according to claim 1, wherein each one of said sectors further comprises a plurality of word lines respectively, and when a regular sector in said first block and a spare sector in the second block are simultaneously selected responding to said supplied address, the word lines in said regular sector and in the spare sector are simultaneously selected.

3. The memory circuit according to claim 2, wherein a word line decoder for selecting a word line in a sector is disposed in each one of said sectors, an input signal of said word line decoder is supplied to a first and second blocks at least in said first period, and the word line selection in the regular sector and the word line selection in the spare sector, which are said simultaneous selections, are performed.

4. The memory circuit according to claim 2, wherein said simultaneously selected word lines are driven to a first voltage in said first period, and after said first period, the word line of which selection is maintained is driven to a second voltage, which is higher than said first voltage.

5. The memory circuit according to claim 4, further comprising a boost circuit for generating a boost power supply which is higher than the power supply,
   wherein said first voltage is power supply voltage level, and said second voltage is boost power supply voltage level, and
   the boost power supply generated by said boost circuit is supplied to the first or second block of which selection is maintained after said first period.

6. The memory circuit according to claim 1, further comprising a block select signal generation circuit for generating a block select signal for selecting said plurality of blocks,
   wherein said block select signal is switched from the first block to the second block when said redundancy judgment result is a match status after said first period.

7. The memory circuit according to claim 1,
   wherein said plurality of blocks are divided into a plurality of pairs of blocks, and
   one of said pair of blocks is said first block and the other is said second block.

8. The memory circuit according to claim 1,
   wherein when the redundancy judgment result is a match, a spare sector enable signal for selecting said spare sector and a sector disable signal for disabling selection of said regular sector are supplied to the respective blocks, and
   the spare sector enable signal to be supplied to said second block is enabled so that said spare sector is selected, in said first period.

9. The memory circuit according to claim 1,
   wherein a Y gate circuit for selecting a bit line in the block is disposed in each one of said blocks, and
   said Y gate selects a bit line in the first block when said redundancy judgment result is a mismatch, and selects a bit line in the second block when said redundancy judgment result is a match.

10. The memory circuit according to claim 9,
    wherein a Y gate select signal to be supplied to said Y gate circuit is driven to a power supply voltage level during said first period, and is driven to a boost power supply voltage level which is higher than said power supply voltage level after said first period, and
    driving of said Y gate select signal is started according to the redundancy judgment result before said first period ends.

11. The memory circuit according to claim 1, further being provided with a simultaneous select mode in which sectors of a plurality of blocks are simultaneously selected, wherein when said redundancy judgment result is a match status, said simultaneous select mode is disabled.

12. The memory circuit according to claim 1, further being provided with a simultaneous erase mode in which sectors of a plurality of blocks are simultaneously selected and erased, wherein when said redundancy judgment result is a match status, said simultaneous erase mode is disabled.

13. A memory circuit having a plurality of memory cells comprising:

a plurality of blocks, each of which comprises a plurality of regular memory cell areas and a spare memory cell area, wherein when a regular memory cell area in a first block out of said plurality of blocks is defective, said defective regular memory cell area is replaced with a spare memory cell area in a second block, and responding to a supplied address, the regular memory cell area corresponding to the supplied address in said first block and the spare memory cell area in the second block are selected simultaneously during a first period, and after said first period, selection of either said regular memory cell area or spare memory cell area, which are simultaneously selected, is maintained according to a result of redundancy judgment on whether the supplied address matches with a redundant address, and selection of the other ends.

14. The memory circuit according to claim 13, wherein each one of said memory cell areas further comprises a plurality of word lines respectively, and when the regular memory cell area in said first block and the spare memory cell area in the second block are simultaneously selected responding to said supplied address, the word lines in said regular memory cell area and in the spare memory cell area are simultaneously selected.

15. The memory circuit according to claim 14, wherein said selected word line is driven to a power supply voltage level during said first period, and after said first period, the word line is driven to a boost power supply level which is higher than said power supply voltage, and after said first period, said boost power supply is supplied to the word line of which selection is maintained according to said redundancy judgment result.

16. The memory circuit according to claim 13, wherein said memory cell area has a plurality of bit lines respectively, said memory circuit further comprises a Y gate which is disposed in each one of said blocks and selects said bit line, and a Y decoder for supplying a Y gate select signal to said Y gate, said Y gate select signal is driven to a power supply voltage level during said first period, and is driven to a boost power supply level which is higher than said power supply voltage after said first period, and after said first period, said boost power supply is supplied to a Y gate select line corresponding to the block of which selection is maintained according to said redundancy judgment result.

17. A memory circuit having a plurality of regular sectors and spare sectors, comprising:

a redundant memory for storing an address of a defective regular sector; and a redundancy judgment circuit for comparing a supplied address and the address in said redundant memory, wherein either said regular sector or said spare sector which is replaced therewith is selected according to a redundancy judgment signal generated by said redundancy judgment circuit, and said redundancy judgment circuit sets said redundancy judgment signal to a match status regardless the address in said redundancy memory so as to enable access to said spare sector responding to a first signal.

18. A memory circuit having a plurality of regular sectors and spare sectors, comprising:

a redundant memory for storing an address of a defective regular sector; and a redundancy judgment circuit for comparing a supplied address and the address in said redundant memory, wherein either said regular sector or said spare sector which is replaced therewith is selected according to a redundancy judgment signal generated by said redundancy judgment circuit, and said redundancy judgment circuit sets said redundancy judgment signal to a mismatch status regardless the address in said redundancy memory, so as to enable access to the regular sector which is replaced by said spare sector responding to a second signal.

* * * * *